United States Patent
Xie et al.

(10) Patent No.: US 11,064,614 B2
(45) Date of Patent: Jul. 13, 2021

(54) CARRIER

(71) Applicants: Tyco Electronics (Shanghai) Co. Ltd., Shanghai (CN); TE Connectivity Corporation, Berwyn, PA (US); Measurement Specialties (Chengdu) Ltd., Chengdu (CN)

(72) Inventors: Fengchun Xie, Shanghai (CN); Dandan Zhang, Shanghai (CN); Roberto Francisco-Yi Lu, Bellevue, WA (US); Lvhai Hu, Shanghai (CN); Qinglong Zeng, Shenzhen (CN); Lan Gong, Shanghai (CN); Qian Ying, Shanghai (CN); Yingcong Deng, Shanghai (CN); Yun Liu, Shanghai (CN)

(73) Assignees: Tyco Electronics (Shanghai) Co. Ltd., Shanghai (CN); TE Connectivity Corporation, Berwyn, PA (US); Measurement Specialties (Chengdu) Ltd., Chengdu (CN)

(*) Notice: Subject to any disclaimer, the term of this patent is extended or adjusted under 35 U.S.C. 154(b) by 114 days.

(21) Appl. No.: 16/571,541

(22) Filed: Sep. 16, 2019

(65) Prior Publication Data
US 2020/0015359 A1   Jan. 9, 2020

Related U.S. Application Data

(63) Continuation of application No. PCT/EP2018/056521, filed on Mar. 15, 2018.

(30) Foreign Application Priority Data

Mar. 17, 2017 (CN) .................. 201710160075.X

(51) Int. Cl.
*H05K 1/00* (2006.01)
*H05K 3/32* (2006.01)
(Continued)

(52) U.S. Cl.
CPC .......... *H05K 3/301* (2013.01); *H05K 7/1053* (2013.01)

(58) Field of Classification Search
CPC .......... H05K 1/00; H05K 3/32; H05K 3/301; H05K 7/10; H05K 7/1053; H05K 13/02; G01R 1/02; G01R 1/04
(Continued)

(56) References Cited

U.S. PATENT DOCUMENTS 4,541,676 A * 9/1985 Hansen ............... G01R 1/0425
439/353
4,543,713 A * 10/1985 Rapp .................... H05K 13/026
29/741
(Continued)

OTHER PUBLICATIONS

PCT Notification, The International Search Report and The Written Opinion of the International Searching Authority, dated Jun. 14, 2018, 12 pages.

*Primary Examiner* — Xiaoliang Chen
(74) *Attorney, Agent, or Firm* — Barley Snyder

(57) ABSTRACT

A carrier includes a base on which a circuit board is mounted, a loading device mounted on the base, a first pressing device mounted on the base, and a second pressing device mounted on the base. The loading device is configured to load an electronic device on the base. The first pressing device is configured to press a first lead end protruding from the electronic device on the circuit board to electrically contact the circuit board. The second pressing device is configured to press a second lead end of the electronic device on the base.

20 Claims, 4 Drawing Sheets

(51) Int. Cl.
*H05K 7/10* (2006.01)
*H05K 13/02* (2006.01)
*G01R 1/02* (2006.01)
*G01R 1/04* (2006.01)
*H05K 3/30* (2006.01)

(58) Field of Classification Search
USPC ........ 361/760; 439/68, 70, 72, 91, 263, 331, 439/342, 353, 912; 29/837, 741; 174/529, 534
See application file for complete search history.

(56) References Cited

U.S. PATENT DOCUMENTS

| | | | | |
|---|---|---|---|---|
| 5,216,583 | A * | 6/1993 | Katsumata | H05K 3/325 174/529 |
| 5,640,303 | A * | 6/1997 | Hooley | H05K 7/1061 165/46 |
| 5,975,915 | A * | 11/1999 | Yamazaki | G01R 1/0433 439/331 |
| 6,027,355 | A * | 2/2000 | Ikeya | H05K 7/1007 439/268 |
| 6,960,092 | B1 * | 11/2005 | Hussain | G01R 1/0466 439/263 |
| 7,147,483 | B1 | 12/2006 | Ju | |
| 2005/0101175 | A1 * | 5/2005 | Cui | H01R 12/88 439/342 |
| 2009/0042415 | A1 * | 2/2009 | Nakamura | G01R 1/0466 439/70 |
| 2014/0134880 | A1 | 5/2014 | Yeh | |

* cited by examiner

CARRIER

This application is a continuation of PCT International Application No. PCT/EP2018/056521, filed on Mar. 15, 2018, which claims priority under 35 U.S.C. § 119 to Chinese Patent Application No. 201710160075.X, filed on Mar. 17, 2017.

FIELD OF THE INVENTION

The present invention relates to a carrier and, more particularly, to a carrier adapted to load an electronic device.

BACKGROUND

In manufacturing an electronic device, a carrier is usually used to load an electronic device. A common electronic device includes rigid needlelike leads, and the electronic device may be put directly in a tray. However, some electronic devices, for example, a heat sensitive sensor made of heat sensitive material, include fine flexible leads. During manufacturing such electronic devices, the flexible leads of the electronic devices are easily pulled off or deformed, and thus the current tray is not suitable to load such electronic devices. The electronic devices with flexible leads are usually manufactured in an artificial way, which not only lowers manufacturing efficiency, but also easily damages the leads of the electronic device.

SUMMARY

A carrier includes a base on which a circuit board is mounted, a loading device mounted on the base, a first pressing device mounted on the base, and a second pressing device mounted on the base. The loading device is configured to load an electronic device on the base. The first pressing device is configured to press a first lead end protruding from the electronic device on the circuit board to electrically contact the circuit board. The second pressing device is configured to press a second lead end of the electronic device on the base.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
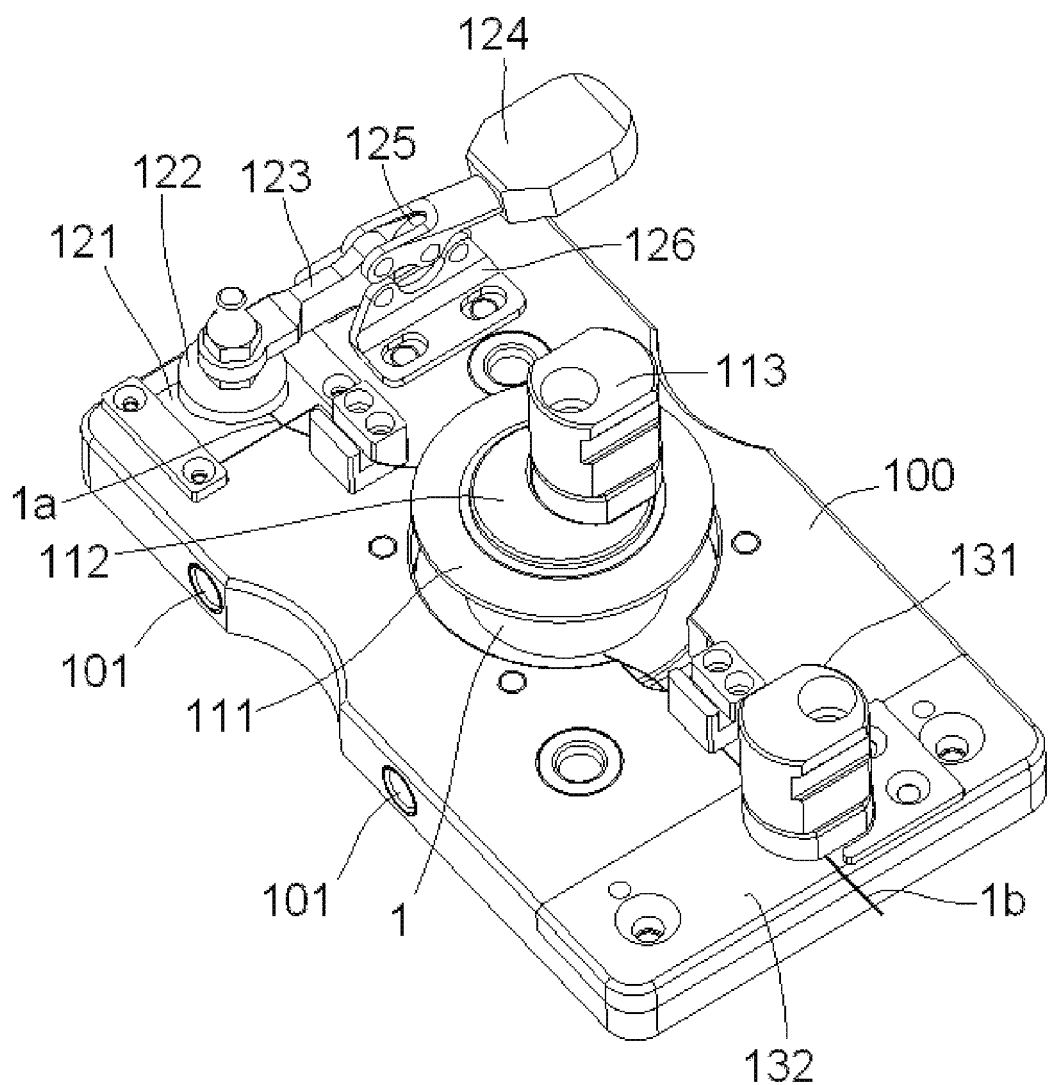
FIG. 1 is a perspective view of a carrier according to an embodiment.

The present disclosure will be described hereinafter in further detail with reference to the following embodiments, taken in conjunction with the accompanying drawings. In the specification, the same or similar reference numerals indicate the same or similar parts. The description of the embodiments of the present disclosure hereinafter with reference to the accompanying drawings is intended to explain the general inventive concept of the present disclosure, and should not be constructed as a limitation to the present disclosure.

In addition, in the following detailed description, for the sake of explanation, numerous specific details are set forth in order to provide a thorough understanding of the disclosed embodiments. It will be apparent, however, one or more embodiments may also be practiced without these specific details. In other instances, well-known structures and devices are illustrated schematically in order to simplify the drawing.

A carrier according to an embodiment, as shown in FIG. 1, comprises a base 100 on which a circuit board 121 is mounted, a loading device 111 mounted on the base 100 and configured to load an electronic device 1, a first pressing device mounted on the base 100 and configured to press a first lead end 1a protruding from the electronic device 1 on the circuit board 121 to electrically contact the circuit board 121, and a second pressing device mounted on the base 100 and configured to press a second lead end 1b of the electronic device 1 on the base 100.

As shown in FIG. 1, the base 100 has a positioning post 112. The loading device 111 includes a center hole 111d, shown in FIG. 2. The positioning post 112 of the base 100 is adapted to be received in the center hole 111d of the loading device 111 to mount the loading device 111.

The carrier, as shown in FIG. 1, comprises a carrier pressing block 113 for holding the loading device 111 on the base 100, which may be rotatably installed on a top surface of the positioning post 112 and is adapted to rotate between a press position and a release position. When the carrier pressing block 113 is driven to rotate to the press position, shown in FIG. 1, the carrier pressing block 113 presses the loading device 111 in order to hold the loading device 111 on the base 100. When the carrier pressing block 113 is driven to rotate to the release position, the carrier pressing block 113 is separated from the loading device 111 to allow the loading device 111 to be detached from the base 100. A rotation axis of the carrier pressing block 113 is offset from an axis of the positioning post 112 by a predetermined distance.

Figure 2:
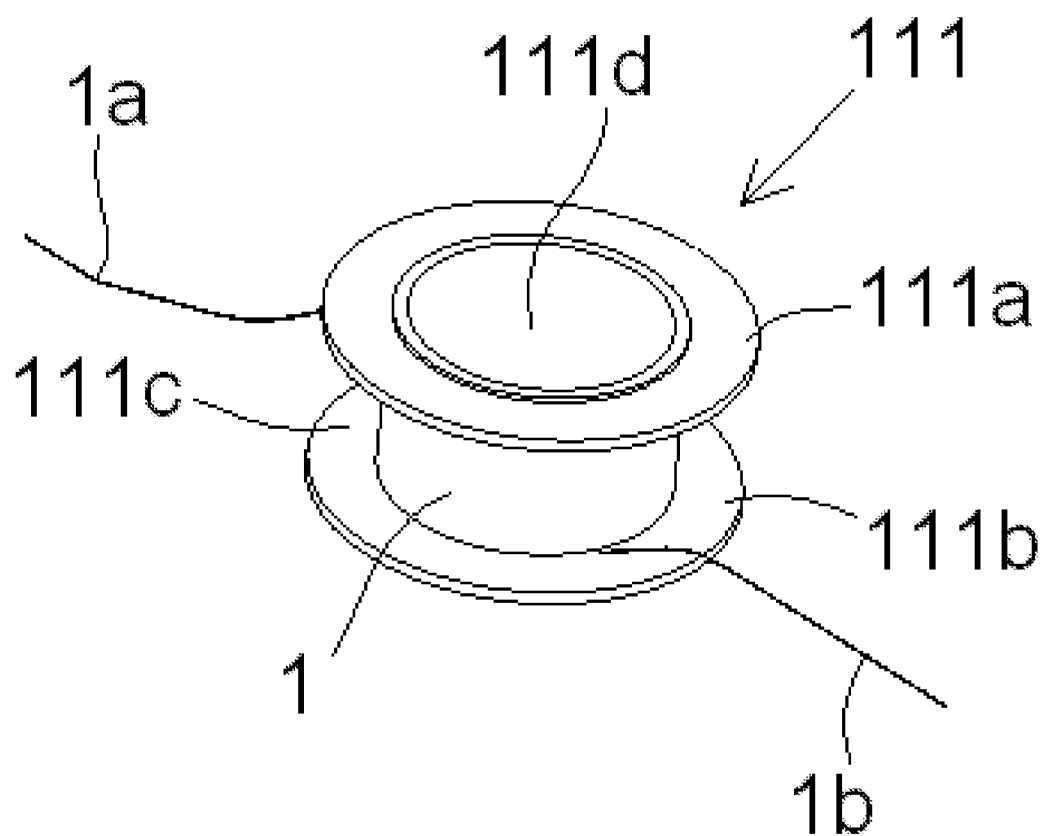
FIG. 2 is a perspective view of a loading device of the carrier and an electronic device.

The loading device 111, as shown in FIG. 2, includes an upper flange portion 111a, a lower flange portion 111b, and a neck portion 111c between the upper flange portion 111a and the lower flange portion 111b. The electronic device 1 is a flexible device adapted to wind on the neck portion 111c of the loading device 111.

In an exemplary embodiment, the electronic device 1 may be a fine flexible heat sensitive resistance sensor made of a heat sensitive material. In this embodiment, the electronic device 1 may be tested by an electrical contact of the first lead end 1a of the electronic device 1 and the circuit board 121. In the embodiment, after the second lead end 1b of the electronic device 1 is mounted on the base 100, a tin plating process may be performed on the second lead end 1b.

The first pressing device, as shown in FIG. 1, includes a pressing lever 123, a first pressing block 122 connected to a front end of the pressing lever 123, a handle 124 connected to a back end of the pressing lever 123, and a support frame 126 mounted on the base 100. The back end of the pressing lever 123 is rotatably connected to the support frame 126. The first pressing device has an elastic component 125 located on the base 100 and adapted to push the handle 124 upward.

As shown in FIG. 1, when downward pressure is not applied to the handle 124, the elastic component 125 is arranged to push the handle 124 upward, so that the first pressing block 122 on the front end of the pressing lever 123 tightly presses down the first lead end 1a. When downward pressure is applied to the handle 124, the handle 124 may drive the front end of the pressing lever 123 to rotate upward, so that the first pressing block 122 is driven to lift up and release the first lead end 1a. When the pressure applied to the handle 124 is released, the handle 124 may drive the front end of the pressing lever 123 to rotate downwards due to the handle 124 being pushed against by the elastic component 125, so that the first lead end 1a is pressed on the circuit board 121 by the first pressing block 122.

The second pressing device, as shown in FIG. 1, includes a positioning plate 132 mounted on the base 100 and formed with a positioning slot adapted to position the second lead end 1b of the electronic device 1, and a second pressing block 131 rotatably mounted on the positioning plate 132 and adapted to rotate between the press position and the release position. When the second pressing block 131 is rotated to the press position, shown in FIG. 1, the second pressing block 131 is arranged to press the second lead end 1b in the positioning slot. When the second pressing block 131 is rotated to the release position, the second pressing block 131 is separated from the second lead end 1b, so that the second lead end 1b may be detached from the positioning slot.

Figure 3:
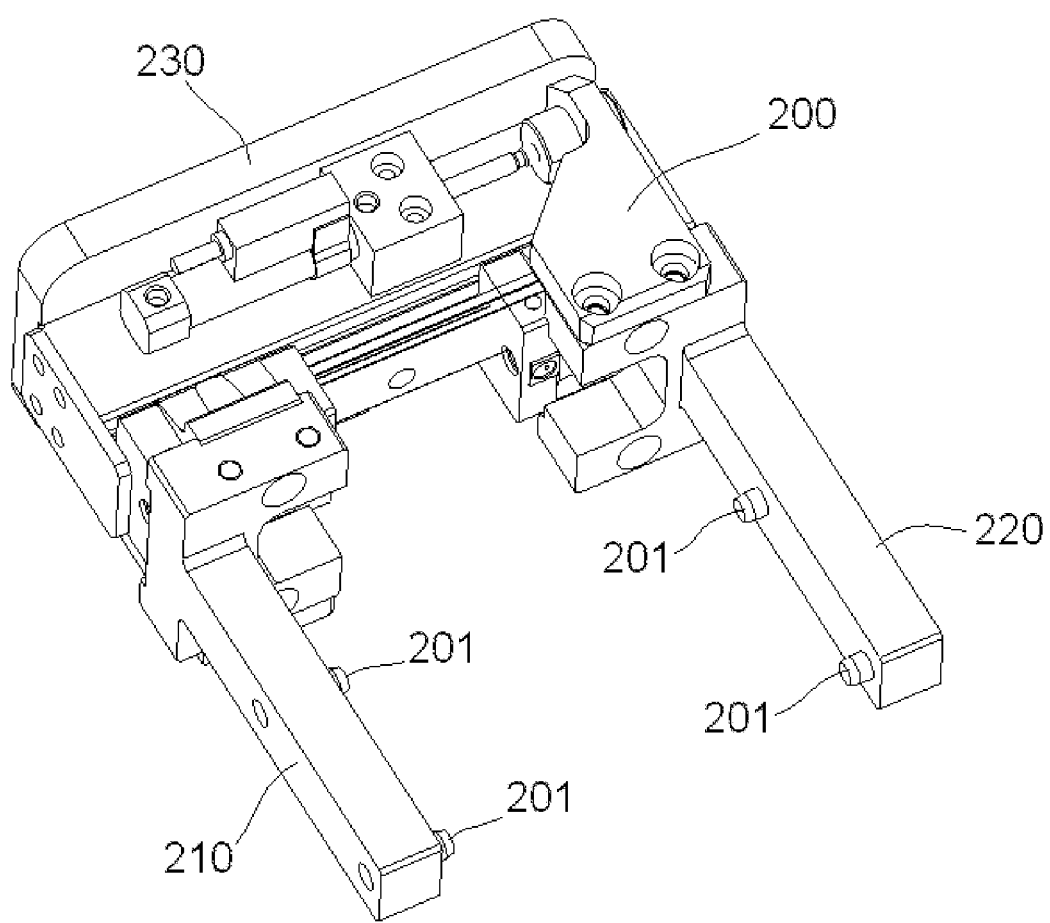
FIG. 3 is a perspective view of a clamping device.
Figure 4:
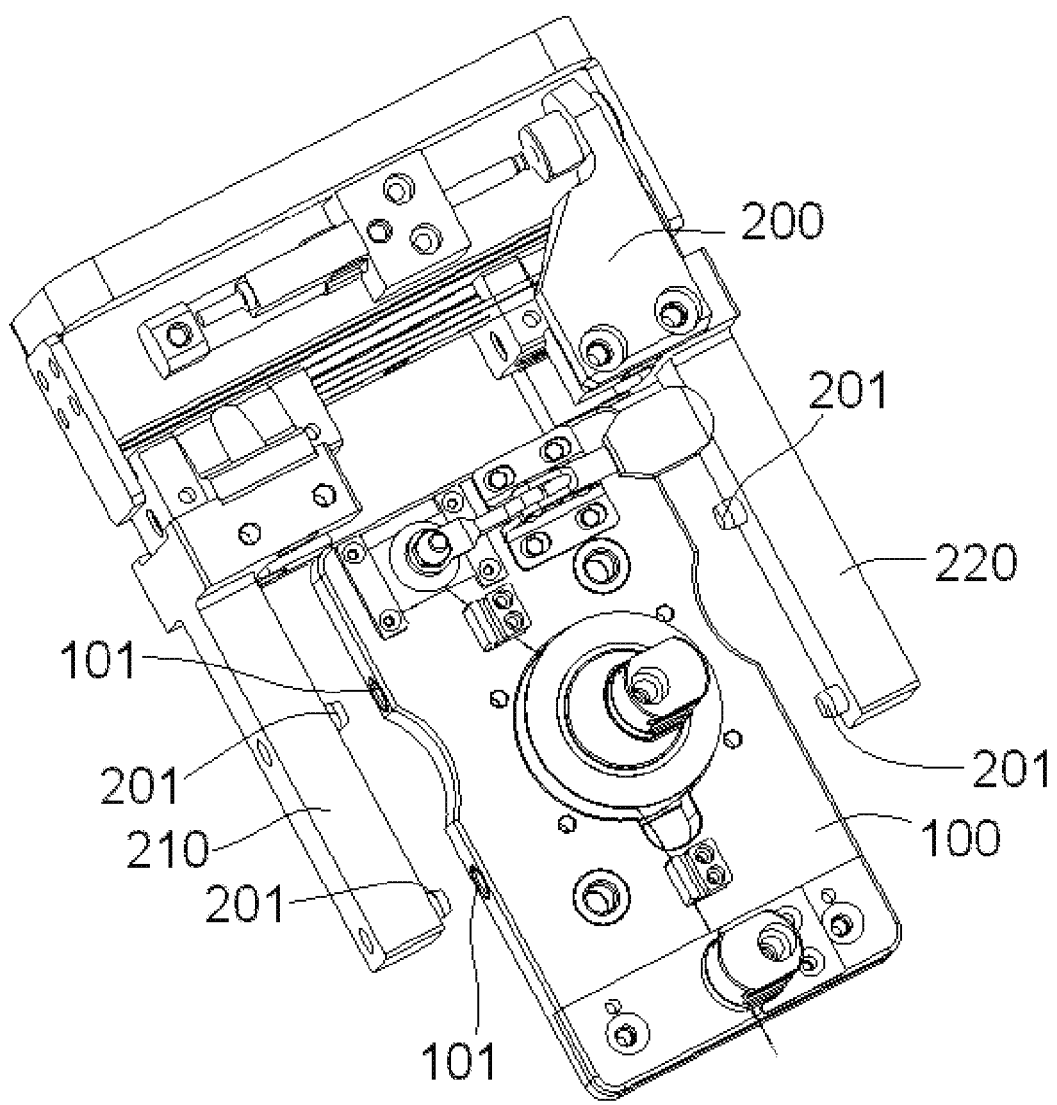
FIG. 4 is a perspective view of the clamping device clamping a base of the carrier.

The carrier, as shown in FIGS. 3 and 4, can be used with a clamping device 200 to clamp the base 100.

The base 100, as shown in FIGS. 1 and 4, has first positioning structures 101 on both sides thereof. The clamping device 200 includes a pair of finger parts 210, 220 that are openable and closable. Second positioning structures 201 are formed inside each of the finger parts 210, 220. When the pair of finger parts 210, 220 of the clamping device 200 are in a closed position, the second positioning structure 201 is mated with the first positioning structure 101, such that the base 100 is reliably clamped and positioned on the clamping device 200. In the shown embodiment, one of the first positioning structure 101 and the second positioning structure 201 is a protruding pin, and the other of the first positioning structure 101 and the second positioning structure 201 is a slot mated with the protruding pin.

In an embodiment, as shown in FIGS. 3 and 4, the clamping device 200 includes a flange 230 adapted to be connected to a robot. In this way, it is easy to connect the carrier to the robot by the flange 230, in order to move or rotate the carrier by the robot.

The first pressing device and the second pressing device are adapted to hold the first lead end 1a and the second lead end 1b of the electronic device 1, and thereby, the carrier is adapted to load the electronic device 1 automatically, improve the manufacturing efficiency and effectively protecting the lead ends 1a, 1b.

It should be appreciated by those skilled in the art that the above embodiments are intended to be illustrative, modifications may be made to the above embodiments by those skilled in the art, and structures described in various embodiments may be freely combined without having structural or principle conflict.

Although the present disclosure has been described with reference to the attached drawings, the embodiments disclosed in the drawings are intended to illustrate embodiments of the present disclosure, but should not be construed as a limitation to the present disclosure. Although some embodiments of the general concept of the present disclosure have been shown and described, it would be appreciated by those skilled in the art that modifications may be made to these embodiments without departing from the principle and spirit of the disclosure, the scope of which is defined in the claims and their equivalents.

What is claimed is:

1. A carrier, comprising:
   a base on which a circuit board is mounted;
   a loading device mounted on the base and configured to load an electronic device on the base;
   a first pressing device mounted on the base and configured to press a first lead end protruding from the electronic device on the circuit board to electrically contact the circuit board; and
   a second pressing device mounted on the base and configured to press a second lead end of the electronic device on the base.

2. The carrier of claim 1, wherein the base has a positioning post and the loading device has a center hole in which the positioning post is received.

3. The carrier of claim 2, further comprising a carrier pressing block holding the loading device on the base.

4. The carrier of claim 3, wherein the carrier pressing block is rotatably installed on a top surface of the positioning post and rotates between a press position and a release position.

5. The carrier of claim 4, wherein, in the press position, the carrier pressing block presses the loading device to hold the loading device on the base, and in the release position, the carrier pressing block is separated from the loading device to allow the loading device to be detached from the base.

6. The carrier of claim 2, wherein the loading device has an upper flange portion, a lower flange portion, and a neck portion between the upper flange portion and the lower flange portion.

7. The carrier of claim 6, wherein the electronic device is a flexible device adapted to wind on the neck portion of the loading device.

8. The carrier of claim 1, wherein the first pressing device includes a pressing lever, a first pressing block connected to a front end of the pressing lever, a handle connected to a back end of the pressing lever, a support frame mounted on the base, the back end of the pressing lever rotatably connected to the support frame, and an elastic component disposed on the base and adapted to push the handle upward.

9. The carrier of claim 8, wherein, when a downward pressure is not applied to the handle, the elastic component pushes the handle upward so that the first pressing block presses down the first lead end.

10. The carrier of claim 9, wherein, when the downward pressure is applied to the handle, the handle drives the front end of the pressing lever to rotate upward so that the first pressing block is driven to lift up and release the first lead end.

11. The carrier of claim 10, wherein, when the downward pressure applied to the handle is released, the handle drives the front end of the pressing lever to rotate downwards due to the elastic component pushing against the handle so that the first pressing block presses the first lead end on the circuit board.

12. The carrier of claim 1, wherein the second pressing device includes a positioning plate mounted on the base and having a positioning slot adapted to position the second lead end of the electronic device, and a second pressing block rotatably mounted on the positioning plate and adapted to rotate between a press position and a release position.

13. The carrier of claim 12, wherein the second pressing block presses the second lead end in the positioning slot in the press position.

14. The carrier of claim 13, wherein the pressing block is separated from the second lead end in the release position, and the second lead end may be detached from the positioning slot.

15. The carrier of claim 1, further comprising a clamping device adapted to clamp the base.

16. The carrier of claim 15, wherein the base has a first positioning structure on each side of the base.

17. The carrier of claim 16, wherein the clamping device has a pair of finger parts that are openable and closable, a second positioning structure is formed inside each of the finger parts.

18. The carrier of claim 17, wherein, when the finger parts are in a closed position, the second positioning structure is mated with the first positioning structure and the base is clamped and positioned on the clamping device.

19. The carrier of claim 18, wherein one of the first positioning structure and the second positioning structure is a protruding pin, and the other of the first positioning structure and the second positioning structure is a slot mated with the protruding pin.

20. The carrier of claim 18, wherein the clamping device has a flange adapted to be connected to a robot.

* * * * *